US009711215B2

(12) United States Patent
Manipatruni et al.

(10) Patent No.: US 9,711,215 B2
(45) Date of Patent: Jul. 18, 2017

(54) APPARATUS AND METHOD TO OPTIMIZE STT-MRAM SIZE AND WRITE ERROR RATE

(71) Applicant: Intel Corporation, Santa Clara, CA (US)

(72) Inventors: Sasikanth Manipatruni, Hillsboro, OR (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/913,676

(22) PCT Filed: Sep. 27, 2013

(86) PCT No.: PCT/US2013/062421
§ 371 (c)(1),
(2) Date: Feb. 22, 2016

(87) PCT Pub. No.: WO2015/047337
PCT Pub. Date: Apr. 2, 2015

(65) Prior Publication Data
US 2016/0203865 A1    Jul. 14, 2016

(51) Int. Cl.
*G11C 11/16* (2006.01)
*G11C 5/02* (2006.01)
(Continued)

(52) U.S. Cl.
CPC ...... *G11C 13/0069* (2013.01); *G11C 11/1653* (2013.01); *G11C 11/1655* (2013.01);
(Continued)

(58) Field of Classification Search
CPC . G11C 11/16; G11C 11/1655; G11C 11/5607; G11C 2213/79; G11C 5/06
(Continued)

(56) References Cited

U.S. PATENT DOCUMENTS 5,291,440 A    3/1994 Koyama
5,587,946 A   12/1996 Campardo et al.
(Continued)

FOREIGN PATENT DOCUMENTS

EP          2455942 A2    5/2012
WO    WO 2012-019135 A2    2/2012

OTHER PUBLICATIONS

PCT International Search Report for counterpart PCT Application No. PCT/US2013/062421, 5 pages, (Jun. 23, 2014).
(Continued)

*Primary Examiner* — Ly D Pham
(74) *Attorney, Agent, or Firm* — Blakely, Sokoloff, Taylor & Zafman LLP

(57) ABSTRACT

Described is an apparatus comprising: a first select-line; a second select-line; a bit-line; a first bit-cell including a resistive memory element and a transistor, the first bit-cell coupled to the first select-line and the bit-line; a buffer with an input coupled to the first select-line and an output coupled to the second select-line; and a second bit-cell including a resistive memory element and a transistor, the second bit-cell coupled to the second select-line and the bit-line. Described is a magnetic random access memory (MRAM) comprising: a plurality of rows, each row including: a plurality of bit-cells, each bit-cell having an MTJ device coupled to a transistor; and a plurality of buffers, each of which to buffer a select-line signal for a group of bit-cells among the plurality of bit-cells; and a plurality of bit-lines, each row sharing a single bit-line among the plurality of bit-cells in that row.

14 Claims, 7 Drawing Sheets

(51) Int. Cl.
    *G11C 5/06*             (2006.01)
    *G11C 5/08*             (2006.01)
    *G11C 13/00*           (2006.01)
    *G11C 11/56*           (2006.01)

(52) U.S. Cl.
    CPC .......... *G11C 11/1675* (2013.01); *G11C 11/16* (2013.01); *G11C 11/5607* (2013.01); *G11C 2213/79* (2013.01); *G11C 2213/82* (2013.01)

(58) Field of Classification Search
    USPC ....................... 365/148, 158, 163, 66, 63, 51
    See application file for complete search history.

(56) References Cited

U.S. PATENT DOCUMENTS

| | | | | |
|---|---|---|---|---|
| 6,067,257 | A * | 5/2000 | Kitsukawa | G11C 11/4074 365/189.09 |
| 6,195,305 | B1 * | 2/2001 | Fujisawa | G11C 5/147 365/226 |
| 6,268,817 | B1 * | 7/2001 | Min | H03M 1/682 341/145 |
| 6,335,890 | B1 | 1/2002 | Reohr et al. | |
| 6,427,197 | B1 * | 7/2002 | Sato | G11C 7/1039 365/189.15 |
| 6,452,859 | B1 * | 9/2002 | Shimano | G11C 8/08 365/230.06 |
| 6,498,747 | B1 | 12/2002 | Gogl et al. | |
| 6,822,891 | B1 * | 11/2004 | Hoya | G11C 11/22 365/145 |
| 7,403,413 | B2 | 7/2008 | Liaw | |
| 7,626,871 | B1 | 12/2009 | Yang et al. | |
| 8,068,379 | B1 * | 11/2011 | Takahashi | G11C 11/4085 365/230.03 |
| 8,315,090 | B2 * | 11/2012 | Ong | 365/158 |
| 8,873,328 | B2 * | 10/2014 | Shin | G11C 5/143 365/158 |
| 2003/0184342 | A1 | 10/2003 | Mueller et al. | |
| 2004/0188714 | A1 | 9/2004 | Scheuerlein et al. | |
| 2004/0264239 | A1 | 12/2004 | Tsang | |
| 2007/0146013 | A1 | 6/2007 | Hsu et al. | |
| 2008/0298124 | A1 | 12/2008 | Wong | |
| 2009/0108383 | A1 | 4/2009 | Horng et al. | |
| 2009/0161422 | A1 | 6/2009 | Zhu et al. | |
| 2009/0262571 | A1 | 10/2009 | Sakimura et al. | |
| 2009/0273961 | A1 * | 11/2009 | Ono | G11C 7/18 365/51 |
| 2010/0118593 | A1 | 5/2010 | Cho et al. | |
| 2010/0214845 | A1 | 8/2010 | Choi | |
| 2010/0271893 | A1 | 10/2010 | Lee | |
| 2010/0309731 | A1 | 12/2010 | Hess et al. | |
| 2011/0249490 | A1 | 10/2011 | Zhu et al. | |
| 2011/0280057 | A1 | 11/2011 | Kim et al. | |
| 2011/0305067 | A1 | 12/2011 | Ueda | |
| 2012/0014174 | A1 | 1/2012 | Rao et al. | |
| 2012/0069639 | A1 | 3/2012 | Hoya | |
| 2013/0028010 | A1 | 1/2013 | Li et al. | |
| 2014/0092665 | A1 | 4/2014 | Ueda et al. | |
| 2015/0070982 | A1 | 3/2015 | Miyakawa et al. | |
| 2015/0117095 | A1 * | 4/2015 | Dray | G11C 11/1675 365/158 |

OTHER PUBLICATIONS

Written Opinion of the International Searching Authority for counterpart PCT Application No. PCT/US2013/062421, 5 pages, (Jun. 25, 2014).

Hun-Chang Yu et al, "Cycling Endurance Optimization Scheme for 1MB STT-MRAM in 40nm Technology", Solid-State Circuits Conference Digest of Technical Papers (ISSCC), 2013 IEEE International TSMC, IEEE 2013 ISCC: Session 12, Non Volatile Memory Solutions. 12.8, Date of Conference: Feb. 17-21, 2013, San Francisco CA, pp. 224-225.

Richard Takemura, et al. "A 32-MB SPRAM with 2T1R Memory Cell, Localized Bi-Directional Write Driver and '1'/'0' Dual-Array Equalized Reference Scheme" IEEE Solid-State Circuits Society IEEE Journal of Solid-State Circuits, vol. 45, No. 4, Apr. 2010, pp. 869-879.

Supplementary European Search Report for European Patent Application No. 13894603.3, dated Mar. 29, 2017.

* cited by examiner

… (1) …

APPARATUS AND METHOD TO OPTIMIZE STT-MRAM SIZE AND WRITE ERROR RATE

CROSS-REFERENCE TO RELATED APPLICATION

This patent application is a U.S. National Phase Application under 35 U.S.C. §371 of International Application No. PCT/US2013/062421, filed Sep. 27, 2013, entitled "APPARATUS AND METHOD TO OPTIMIZE STT-MRAM SIZE AND WRITE ERROR RATE", which is hereby incorporated by reference.

BACKGROUND

On chip embedded MRAM (magnetic random access memory) with non-volatility can enable energy and computational efficiency with memory density exceeding high density SRAM (static random access memory). However, leading STT-MRAM (Spin-Transfer Torque Magnetic Random Access Memory) integrated with advanced CMOS (e.g., 14 nm and smaller CMOS process technology nodes) suffer from high voltage and high current-density problems during the programming (i.e., writing operation) of a bit-cell.

For example, STT-MRAM integrated with advanced CMOS process technology exhibit insufficient drive current which is caused by intrinsic high resistance of the MRAM device during a write operation from anti-parallel to parallel state. STT-MRAM integrated with advanced CMOS process technology also exhibits high write error rates and/or low speed switching (e.g., exceeding 20 ns) in MTJ based MRAM due to the insufficient drive current. STT-MRAM integrated with advanced CMOS process technology also exhibits reliability issues due to overdriving of bits near the write driving circuitry. These and other problems are expected to grow as CMOS process scales to lower metal-0 (M0) pitches.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
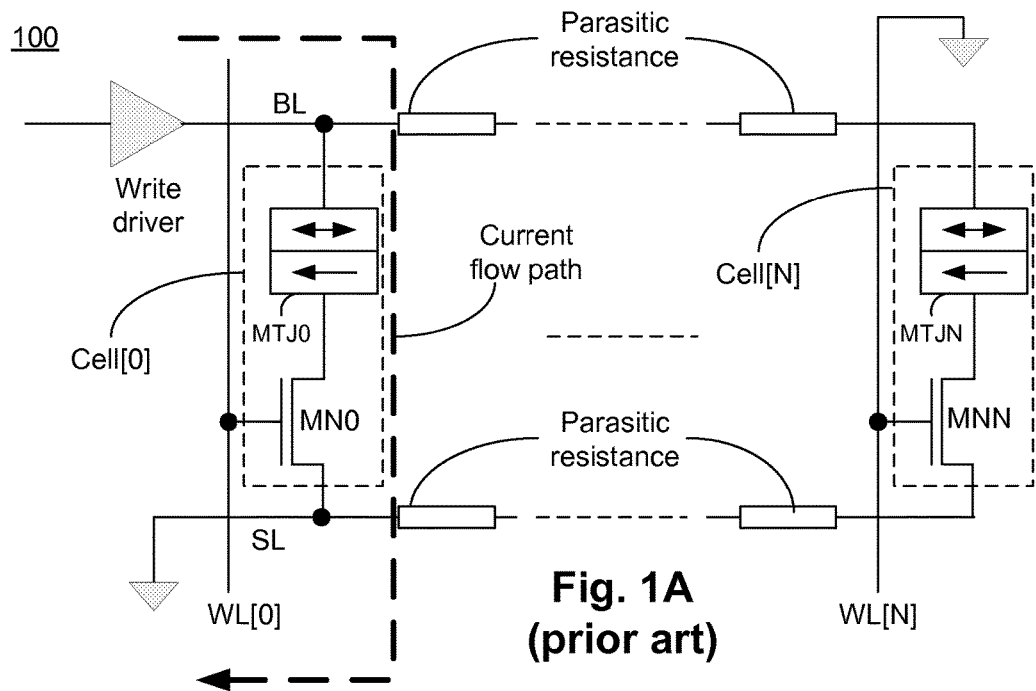
FIGS. 1A-B illustrate rows of an MRAM (magnetic random access memory) array which produce high stress on the bit-cells nearer to the driving end and high write error rate for the bit-cells farther from the driving end.
Figure 1B:
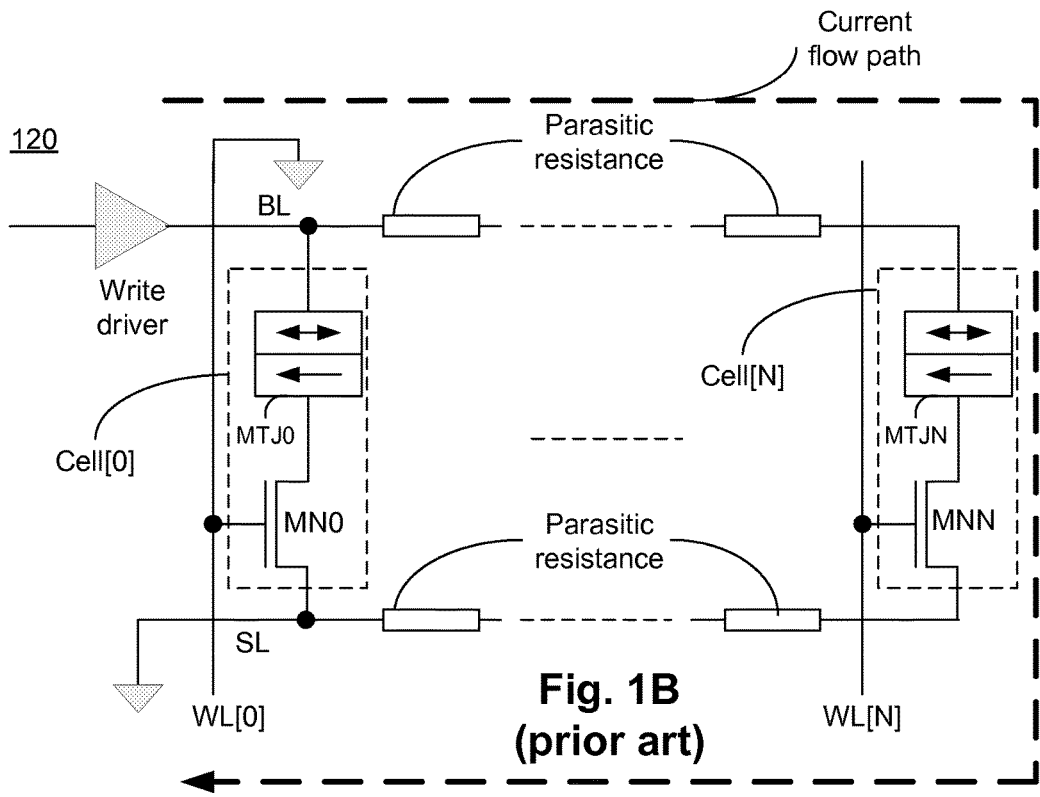

FIGS. 1A-B illustrate rows of an MRAM array which produce high stress on the bits nearer to the driving end and high write error rate for the bits farther from the driving end. FIG. 1A illustrates a row 100 of an MRAM array having a write driver to drive bit-line (BL) signal path for a plurality of MTJ based bit-cells i.e., Cell[0] to Cell[N], where 'N' is an integer greater than 1. Each bit-cell includes an MTJ device with its free ferromagnetic layer coupled to BL, the fixed ferromagnetic layer coupled to a transistor e.g., n-type transistor (also called select transistor), and gate terminal of the transistor coupled to a word-line (WL).

For example, Cell[0] has MTJ0 device coupled in series with n-type transistor MN0 such that the drain terminal of MN0 is coupled to the fixed ferromagnetic layer, source terminal of MN0 is coupled to select-line (SL) signal path, and gate terminal is coupled to word-line WL[0]. Likewise, Cell[N] has MTJN device coupled in series with n-type transistor MNN such that the drain terminal of MNN is coupled to the fixed ferromagnetic layer, source terminal of MNN is coupled to SL signal path, and gate terminal is coupled to word-line WL[N].

The read and write current paths for each bit-cell are identical, resulting in many design trade-offs. For example, during read operation, higher resistance of MTJ device is desired than during write operation. However, having the same current paths for passing read and write currents discourages from having different resistances for read and write operations. To write a logical high to a bit-cell, BL is raised relative to SL, and to write a logical low to a bit-cell, BL is lowered relative to the SL. To read from a bit-cell, SL is set to logical low and MTJ device resistance is sensed using weak current (e.g., $\frac{1}{8}^{th}$ of write current). All bit-cells in the same row share the same BL and SL. In FIG. 1A, WL[0] is selected and WL for the other bit-cells is set to logical low i.e., ground. The resulting current path is shown by the dotted arrow path which produces high stress on Cell[0].

The bit-cells may have large write current (e.g., greater than 100 μA) and large voltage (e.g., greater than 0.7V) requirements of tunnel junction based MTJ devices. The bit-cells may have high write error rates and/or low speed switching (e.g., exceeding 20 ns) in MTJ based MRAM. The bit-cells may also have reliability issues due to tunneling current in magnetic tunnel junctions. For example, insulator layer in the MTJ device is a barrier (e.g., 1 KΩ to 10 KΩ) which resists flow of large current, and lower current flow causes higher write errors.

FIG. 1B illustrates a row 120 of the MRAM array in which the last Cell[N] is selected by WL[N]. In this example, WL[N] is logical high while WLs for other bit-cells is logical low. To avoid write errors on Cell[N], the write driver has to drive a large current to compensate for the IR (i.e., current times resistance) drop caused by parasitic resistances on both BL and SL signal paths. The current path is shown by the dotted bold line. In this example, high current is used to reduce write errors for bit-cells farther from the driving side. However, bit-cells near to the driving side experience high stress because of the high current used to reduce write errors.

As CMOS process nodes shrink, and higher memory densities are desired, MRAMs are formed using more of the lower metal layers in the process. Lower metal layers provide smaller pitches than higher metal layers, and thus allow for more compact MRAMs. However, lower metal layers have high IR (i.e., current times resistance) drop. Higher IR drop causes high write error rates and/or low speed switching for low drive current. To improve write error rates and to speed up the switching process, high drive current can be used, but such current may cause reliability issues due to overdriving of bit-cells near the write driving circuitry.

The embodiments describe a bit-cell row where a repeater is inserted into the SL signal path at different intervals. In one embodiment, repeaters are placed at periodic intervals on the SL signal path. In one embodiment, repeaters preserve the bidirectional current used by the MTJ device based bit-cells for write operation. In one embodiment, BL signal path is a continuous signal path (i.e., does not have repeaters in the signal path) to allow reading of MTJ device based bit-cells. In one embodiment, the repeater is a CMOS based buffer having two inverters coupled together in series such that one inverter drives the other inverter.

The embodiments, allow improving the drive current to the MTJ device based bit-cells without causing high stress to the MTJ device based bit-cells while lowering write error rate. In one embodiment, the maximum applied voltage across the MTJ in a bit-cell is limited to Vcc-$V_{SL}$ of the repeater, where Vcc is the power supply and $V_{SL}$ is the voltage on SL signal path. The embodiments allow the select transistors to suffer from a reduced degradation of the source voltage signal resistance drop on the SL signal path. The above technical effects are non-limiting technical effects. Other technical effects can be derived from the embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more major constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another more advanced process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2:
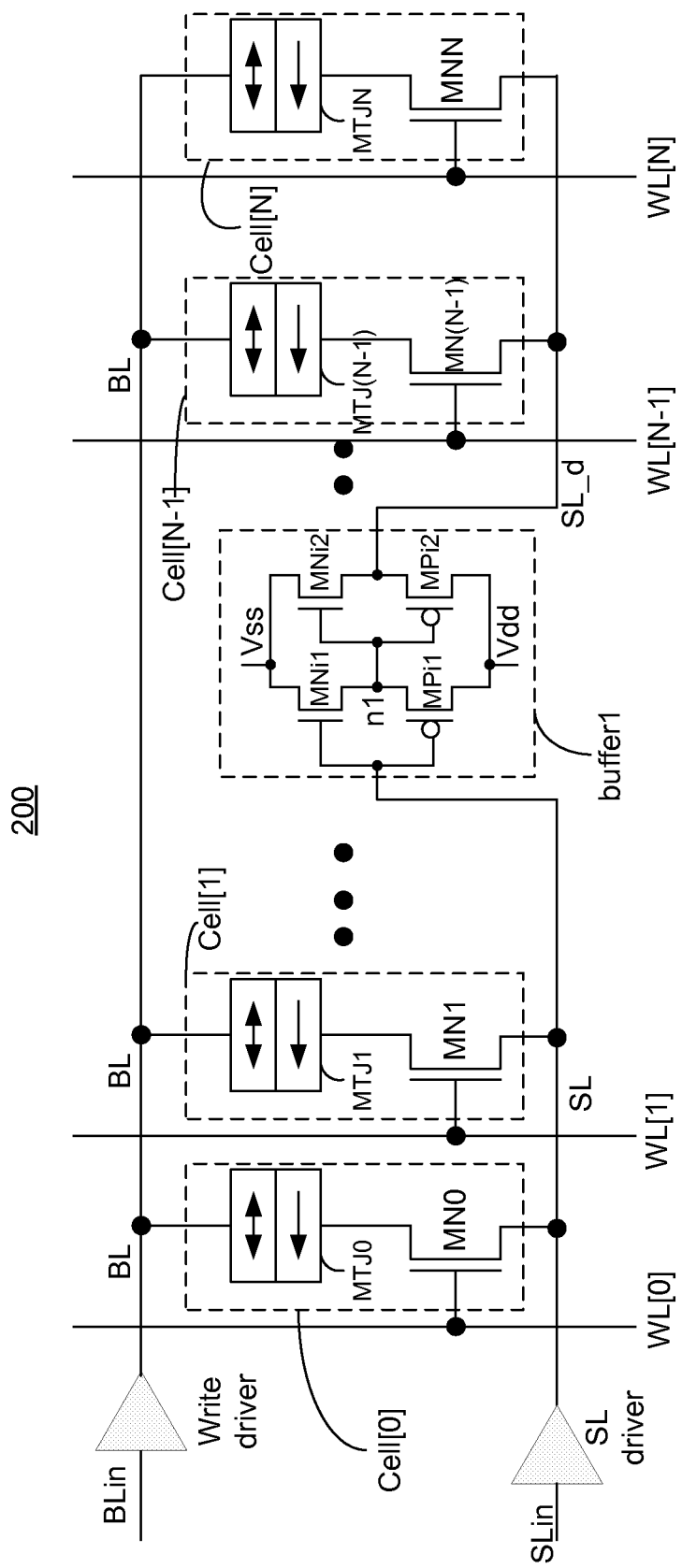
FIG. 2 illustrates a row of an MRAM array with embedded repeaters on select-line (SL) signal path, according to one embodiment of the disclosure.

FIG. 2 illustrates a row 200 of an MRAM array with embedded repeaters on select-line (SL) signal path, according to one embodiment of the disclosure. It is pointed out that those elements of FIG. 2 having the same reference numbers (or names) as the elements of any other figure can operate or function in any manner similar to that described, but are not limited to such.

In one embodiment, row 200 includes a plurality of MTJ device based bit-cells—Cell[0]-Cell[N] controlled by WL[0] to WL[N] respectively. While the embodiments are described with reference to MTJ devices, the embodiments can also be used for other resistive memory devices. Resistive memory devices may comprise at least one of the following: phase change memory elements, ferroelectric memory elements, metal-insulator transition memory elements, conductive bridge memory elements, oxide resistive memory elements. In one embodiment, each MTJ device based bit-cell includes a respective MTJ device (e.g., MTJ0-MTJN) and a select transistor (e.g., MN0-MNN). In one embodiment, row 200 comprises buffer1 (also referred to as a repeater) positioned on the SL signal path. In one embodiment, SL driver drive SLin signal on to SL signal path. In one embodiment, buffer1 amplifies signal on SL signal path and provides the amplified SL signal on to SL_d signal path for other cells in row 200. While the embodiment illustrates a single repeater cell, multiple repeater cells are included in the SL signal path to repeat SL signal. In one embodiment, write driver receives BLin signal and drives BL signal over a continuous BL signal path which is coupled to all bit-cells in row 200.

In one embodiment, buffer1 comprises a first inverter and a second inverter. In one embodiment, first inverter comprises a p-type transistor MPi1 coupled in series with n-type transistor MNi1. In one embodiment, second inverter comprises a p-type transistor MPi2 coupled in series with n-type transistor MNi2. In one embodiment, output n1 of the first inverter is coupled to input n1 of the second inverter. In one embodiment, input of first inverter is coupled to SL signal path, and output of the second inverter is coupled to SL_d signal path.

MTJ devices use bidirectional writing process i.e., current is passed through the MTJ device of an enabled bit-cell in both directions. One reason for using bidirectional writing process is to switch spin torque from parallel to anti-parallel state (i.e., logical high state) and from anti-parallel state to parallel state (i.e., logical low state). In one embodiment, during write operation in which a logical high is written to an MTJ device based bit-cell, current flows from the BL signal path to the MTJ device. In such an embodiment, SL signal path is kept at logical low level (i.e., Vss) by the write driver which allows for the MTJ device current to flow from the free ferromagnetic layer of the MTJ device to the fixed ferromagnetic layer of the MTJ device. In one embodiment, the current in the write operation, in which a logical low is written to a bit-cell, is in the opposite direction as that for when writing a logical high is employed.

In one embodiment, repeaters (e.g., buffer1) are only placed on the SL signal path to drive SL signal to substantially reduce overdrive (and high stress) issues discussed with reference to FIGS. 1A-B. In such an embodiment, driving voltage on SL signal path are generated locally by the repeaters.

Figure 3A:
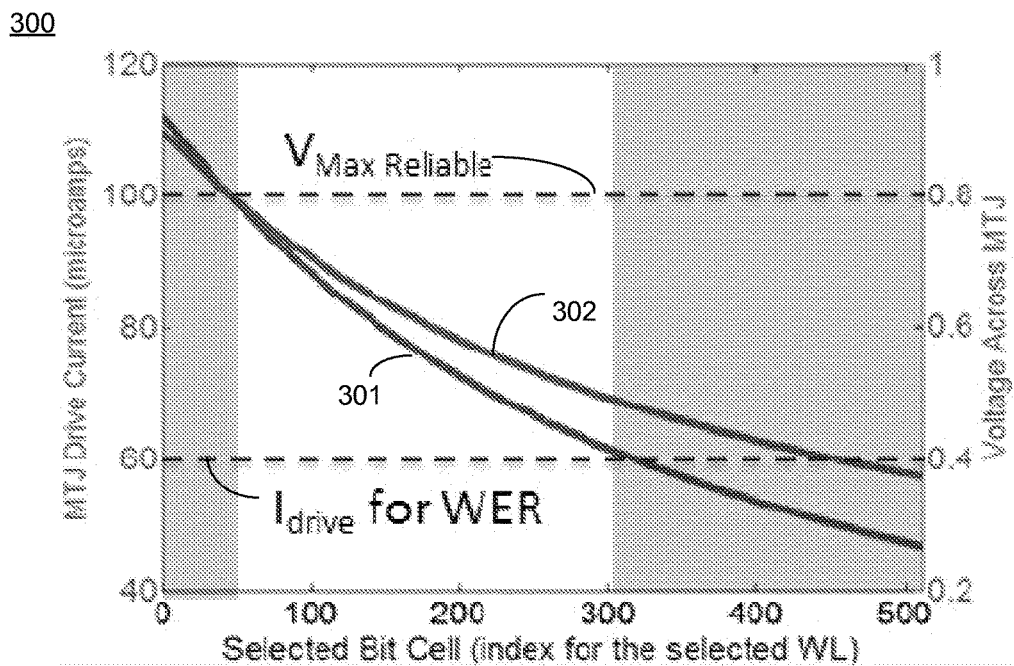
FIG. 3A illustrates a plot showing drive voltage and current for MTJ (magnetic tunneling junction) devices with traditional scheme of FIGS. 1A-B according to one embodiment of the disclosure.

FIG. 3A illustrates a plot 300 showing drive voltage and current for MTJ (magnetic tunneling junction) devices with traditional scheme of FIGS. 1A-B. It is pointed out that those elements of FIG. 3A having the same reference numbers (or names) as the elements of any other figure can operate or function in any manner similar to that described, but are not limited to such.

In this example, write current and write voltage, across the MTJ device of a typical MRAM array, are illustrated. In this example, a 512 bit MRAM array is considered. The x-axis of plot 300 is selected bit-cell (i.e., index for selected WL). The y-axis to the left of plot 300 is MTJ drive current in µA. The y-axis to the right of plot 300 is voltage across the MTJ device. The top horizontal dashed line is maximum reliable voltage ($V_{MaxReliable}$) that can be applied to a MTJ based bit-cell. The bottom horizontal dashed line is the voltage level below which drive current ($I_{drive}$) causes write error rate to exceed above a threshold level.

In this example, $I_{drive}$ of 60 µA is considered as the limit for meeting the write error rate (WER) of the MTJ device. Waveform 301 represents MTJ device drive current for different bit-cells selected in the 512 MRAM array. In this example, $V_{MaxReliable}$ target is set at 0.8V to meet reliability requirements where the applied voltage across the MTJ device does not affect the long time reliability of the MTJ device in the bit-cell. Waveform 302 represents voltage across MTJ device for different bit-cells selected in the 512 MRAM array.

The traditional scheme, as shown in FIG. 3A, suffers from increased write error rate for WLs 300-512 (i.e., shaded region on right of plot 300). In this example, $V_{MaxReliable}$ is exceeded for the bit-cells closer to the driver causing reliability problems on MTJ devices for WLs 1-50 (i.e., shaded region on left of plot 300).

Figure 3B:
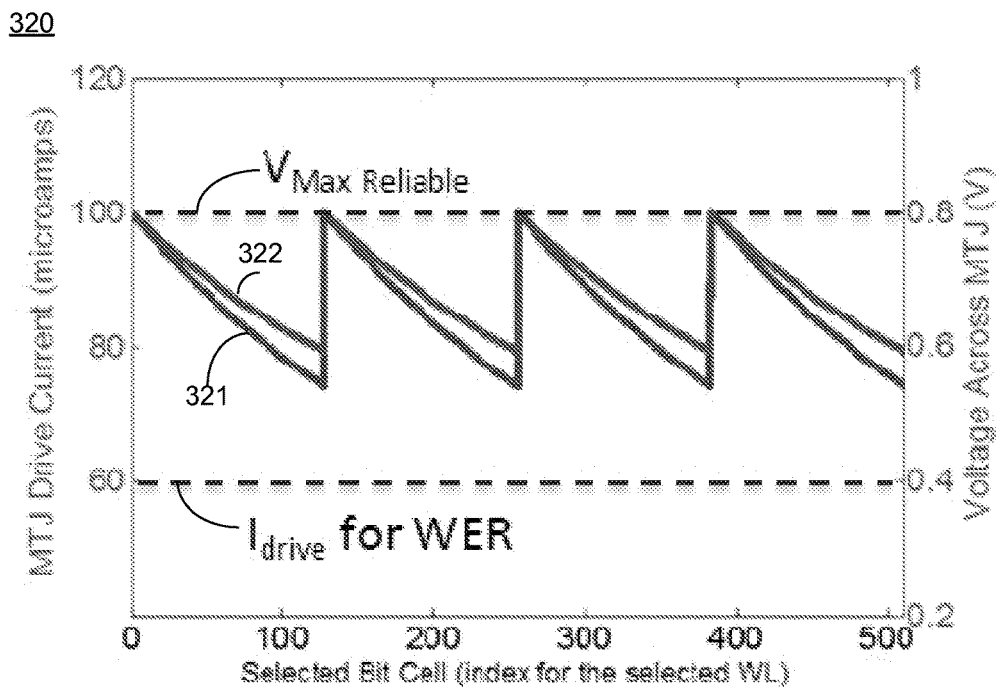
FIG. 3B illustrates a plot showing drive voltage and current for MTJ devices used in the scheme of FIG. 2, according to one embodiment of the disclosure.

FIG. 3B illustrates a plot 320 showing drive voltage and current for MTJ devices used in the scheme of FIG. 2, according to one embodiment. It is pointed out that those elements of FIG. 3B having the same reference numbers (or names) as the elements of any other figure can operate or function in any manner similar to that described, but are not limited to such.

For the embodiment of FIG. 2, write current across the MTJ device is kept above the required $I_{drive}$ for meeting write error rate targets. Waveform 321 represents MTJ device drive current for different bit-cells selected in the 512 MRAM array. For the embodiment of FIG. 2 (which uses repeaters on SL signal path), the maximum voltage applied anywhere in the bit row of the 512 bit MRAM array is below $Vcc-V_{SL}$ of the repeated driver and the select transistor (i.e., n-type transistor coupled to the MTJ device). Waveform 322 represents voltage across the MTJ device(s) for different bit-cells selected in the 512 MRAM array.

The embodiment of FIG. 2 improves the drive current to the bit-cell and allows for a lower write error rate across the row for a given write pulse width. The embodiment of FIG. 2 also limits the maximum applied voltage across the MTJ device to $Vss-V_{SL}$ of the repeater. In these embodiments, the select transistors suffer from a reduced degradation of the source voltage since the SL resistance drop is reduced compared to the traditional scheme of FIGS. 1A-B.

Figure 4:
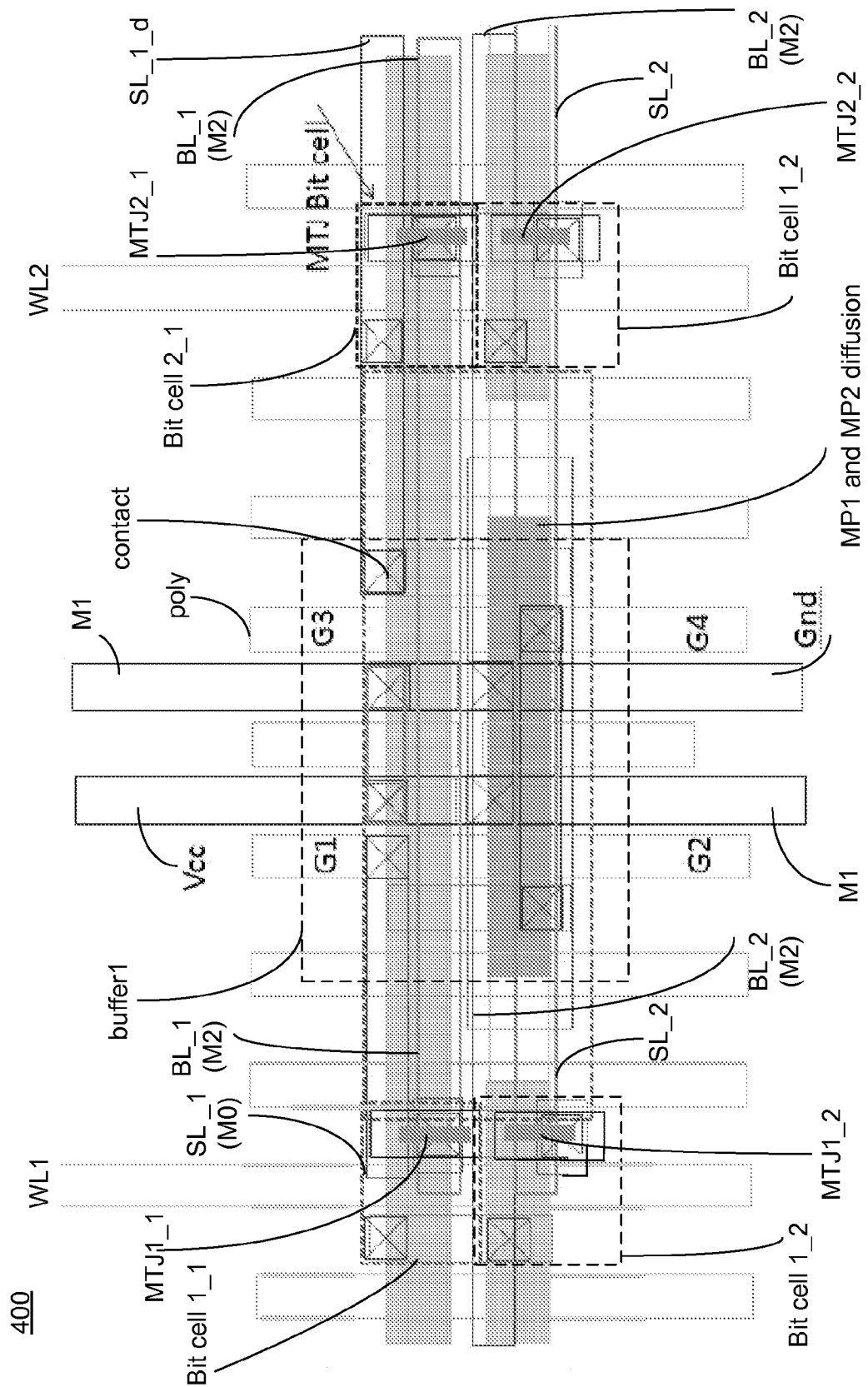
FIG. 4 illustrates a layout of part of two rows of an MRAM array with a repeater on SL signal path, according to one embodiment of the disclosure.

FIG. 4 illustrates a layout 400 of part of two rows of an MRAM array with a repeater on SL signal path, according to one embodiment. It is pointed out that those elements of FIG. 4 having the same reference numbers (or names) as the elements of any other figure can operate or function in any manner similar to that described, but are not limited to such.

Layout 400 is an example layout consistent with a unidirectional design rule on the lower metal layers. In this exemplary embodiment, two bit-cell rows are shown with a total of four bit-cells. Bit-cells, shown in dotted boxes, in the first row are Bit-cell 1_1 and Bit-cell 2_1. Bit-cells, shown in dotted boxes, in the second row are Bit-cell 1_2 and Bit-cell 2_2. Each bit-cell has its respective MTJ device and select transistor coupled to a WL. In this example, Bit-cell 1_1 includes MTJ1_1 device and a select transistor coupled to WL1. Bit-cell 1_2 includes MTJ1_2 device and a select transistor coupled to WL1. Bit-cell 2_1 includes MTJ2_1 device and a select transistor coupled to WL2. Bit-cell 2_2 includes MTJ2_2 device and a select transistor coupled to WL2.

In this example, MTJ based bit-cells include two M0 lines (metal zero) vertically and 1.5 poly pitches horizontally. In one embodiment, the select transistor (i.e., n-type transistor) is contacted by the MTJ device on the drain side and by the SL on the source side via metal M0. In one embodiment, MTJ device is formed between back-end-of-the line (BEOL) metal layers M1-V1-M2-V2-M3-V3, where M1 is the first metal layer, V1 is the via connecting M1 to M2, M2 is the second metal layer, V2 is the via connecting M2 to M3, M3 is the third metal layer, and V3 is the via connecting metal 3 to higher metal. In this embodiment, MTJ device in each bit-cell is contacted on one side by the drain terminal of the n-type transistor and the other side by BL from M4 (i.e., metal 4). Here, contacts (which represents vias) is shown by boxes with crossed lines.

In this embodiment, BL is formed in M2 while SL is formed in M0 i.e., BL_1 (bit-line of row 1) is on M2, BL_2 (bit-line of row 2) is on M2, SL_1 (select line of row 1) is in M0, SL_1_d (select line of row 1 after being repeated) is on M0, SL_1, and SL_2 (select line of row 2) is in M0. In one embodiment, BL is continuous and is not repeated.

In one embodiment, repeater (or buffer1) is formed between the bit-cells as shown. In one embodiment, repeater is formed using n and p wells. In one embodiment, power (Vcc) and ground are brought to the cell using M1, and extend parallel to the direction of gates of the devices in buffer1. Here, G1 is the gate terminal of MNi1, G2 is the gate terminal of MPi1, G3 is the gate terminal of MNi2, and G4 is the gate terminal of MPi2. In this embodiment, MP1 and MP2 diffusion areas extend perpendicular to the power and ground rails. In one embodiment, length of the MRAM array parallel to the gate is smaller than the length of the array perpendicular to the gate. In this embodiment, voltage drop in M1 line is negligible. In this embodiment, repeater gates G1 and G2 couple to SL_1 and gates G3 and G4 couple to SL_1_d. SL_1_d then couples to the source terminal of MTJ2_1 device.

In one embodiment, SL is formed in M1 and BL is formed in M3. In such an embodiment, MTJ device is formed in area dedicated for V1, M2, and V2. In one embodiment, SL is formed in M2 and BL is formed in M4. In such an embodiment, MTJ device is formed in area dedicated for V3, M3, and V4.

Figure 5:
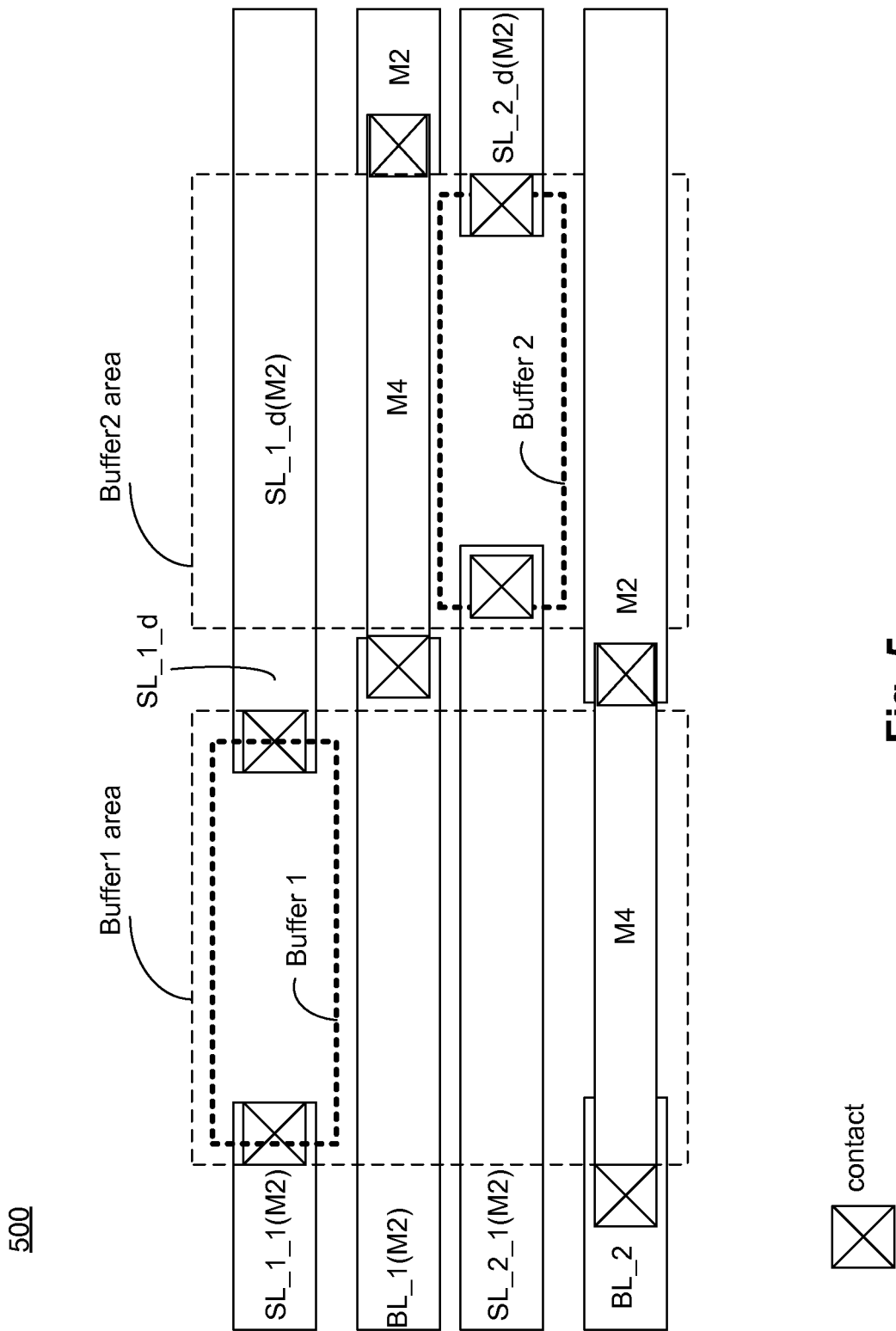
FIG. 5 illustrates a layout of part of two rows of an MRAM array with two repeaters on SL signal path, according to one embodiment of the disclosure.

FIG. 5 illustrates a layout 500 of part of two rows of an MRAM array with two repeaters on SL signal path, according to one embodiment of the disclosure. It is pointed out that those elements of FIG. 5 having the same reference numbers (or names) as the elements of any other figure can operate or function in any manner similar to that described, but are not limited to such.

Layout 500 is a high level abstraction of layout 400, but with two repeaters. In this embodiment, repeater 1 (i.e., buffer1) repeats SL for row 1 while repeater 2 (i.e., buffer 2) repeats SL for row 2. In one embodiment, the repeaters are staggered in a saw tooth fashion along the rows. Another way to view the repeaters is that they are positioned along multiple diagonals of the MRAM array. In the embodiments, BL remains continuous through out the respective row, but may have to "fly over" a buffer region.

For example, BL_1 extends on M2 and then is routed using M4 over buffer2 area, and then back to M2. Likewise, BL_2 is routed using M4 over buffer1 area and back to M2 after crossing the buffer1 area. The packing of repeaters between bit-cells in the row as shown in the embodiments allow formation of high density MRAM arrays that do not suffer from the disadvantages discussed with reference to FIGS. 1A-B.

Figure 6:
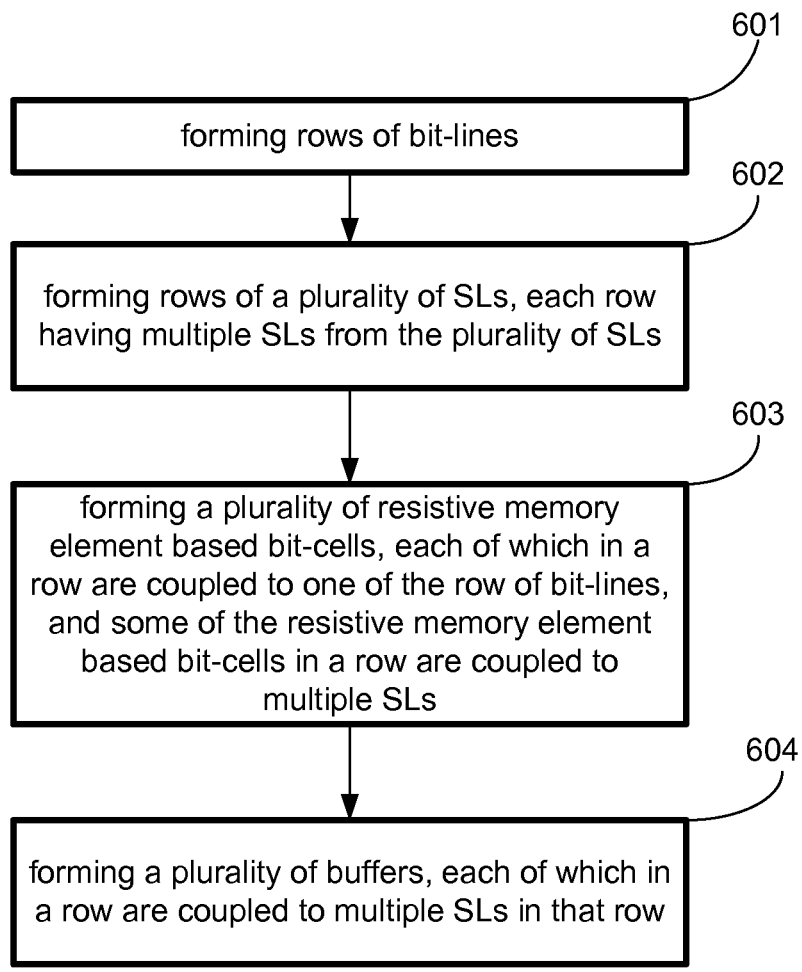
FIG. 6 is a flowchart of a method for forming MRAM array with embedded repeaters, according to one embodiment of the disclosure.

FIG. 6 is a flowchart 600 of a method for forming MRAM array with embedded repeaters, according to one embodiment of the disclosure. Although the blocks in the flowcharts with reference to FIG. 6 are shown in a particular order, the order of the actions can be modified. Thus, the illustrated embodiments can be performed in a different order, and some actions/blocks may be performed in parallel. Some of the blocks and/or operations listed in FIG. 6 are optional in accordance with certain embodiments. The numbering of the blocks presented is for the sake of clarity and is not intended to prescribe an order of operations in which the various blocks must occur. Additionally, operations from the various flows may be utilized in a variety of combinations.

It is pointed out that those elements of FIG. 6 having the same reference numbers (or names) as the elements of any other figure can operate or function in any manner similar to that described, but are not limited to such. At block 601, rows of bit-lines are formed. At block 602, rows of a plurality of SLs are formed. In one embodiment, each row has multiple SLs from the plurality of SLs. For example, one SL signal path is coupled to an input of the repeater and another one is coupled to output of the repeater. At block 603, a plurality of resistive memory element based bit-cells (e.g., those with MTJ or other resistive memory elements) are formed. In one embodiment, each of the bit-cells in a row is coupled to one of the rows of bit-lines. In one embodiment, some of the bit-cells in a row are coupled to multiple SLs. At block 604, a plurality of buffers is formed. In one embodiment, each of the buffers in a row is coupled to the multiple SLs in that row. For example, one SL is coupled to an input of the buffer and another one of the SL is coupled to an output of the buffer.

Figure 7:
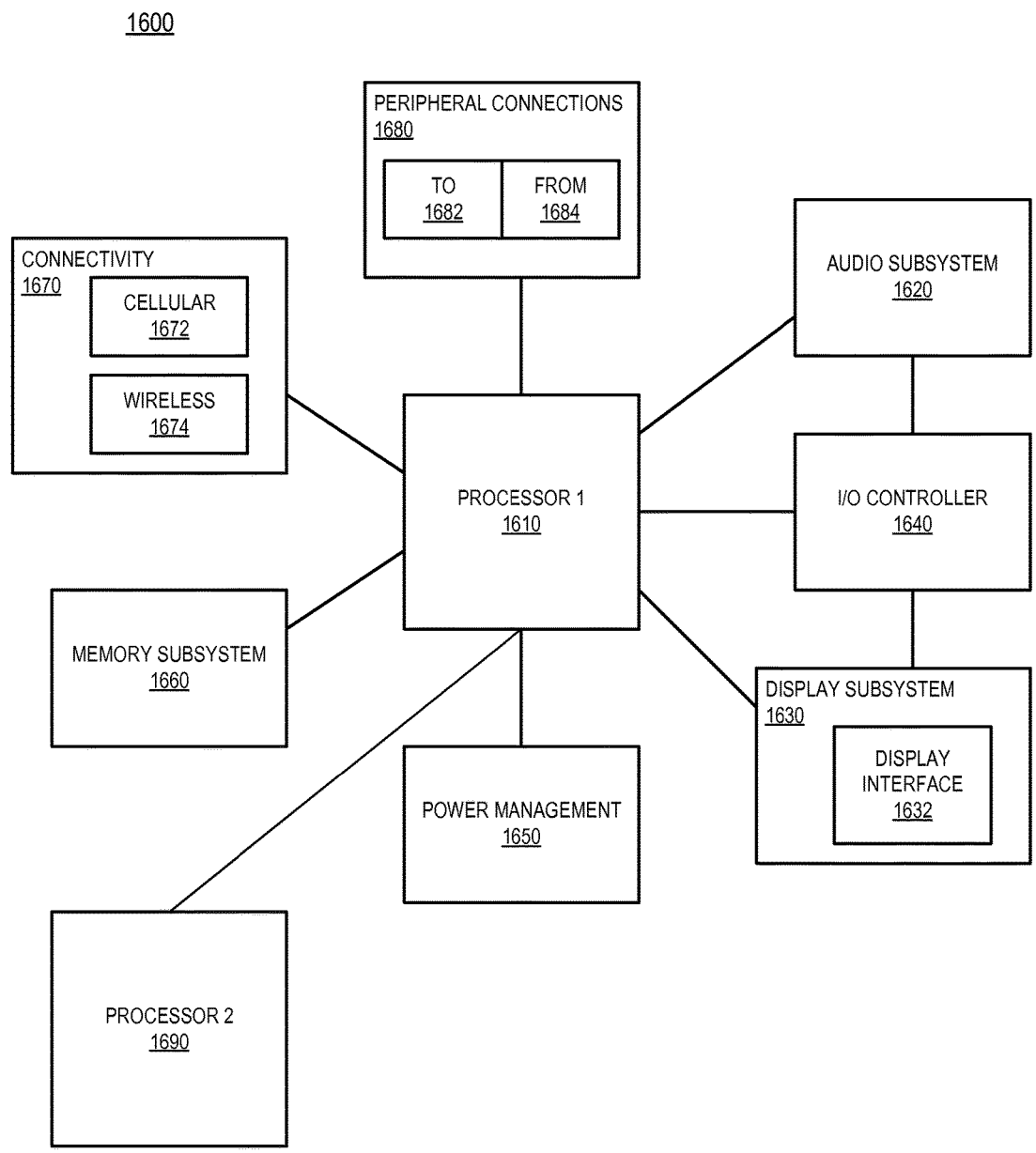
FIG. 7 is a smart device or a computer system or an SoC (System-on-Chip) with an MRAM array with embedded repeaters on SL signal path, according to one embodiment of the disclosure.

FIG. 7 is a smart device or a computer system 1600 or a SoC (System-on-Chip) with an MRAM array with embedded repeaters on SL signal path, according to one embodiment of the disclosure. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with MRAM array with embedded repeaters on SL signal path, according to the embodiments discussed. Other blocks of the computing device 1600 may also include the MRAM array with embedded repeaters on SL signal path of the embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. In one embodiment, process 1690 is optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), Display-Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment an apparatus is provided which comprises: a first select-line; a second select-line; a bit-line; a first bit-cell including a resistive memory element and a transistor, the first bit-cell coupled to the first select-line and the bit-line; a buffer with an input coupled to the first select-line and an output coupled to the second select-line; and a second bit-cell including a resistive memory element and a transistor, the second bit-cell coupled to the second select-line and the bit-line.

In one embodiment, the first bit-cell includes: a first terminal coupled to the bit-line; a second terminal coupled to the first select-line; and a third terminal coupled to a word-line. In one embodiment, the second bit-cell includes: a first terminal coupled to the bit-line; a second terminal coupled to the second select-line; and a third terminal coupled to a word-line. In one embodiment, each of the resistive memory elements of the first and second bit-cells includes an MTJ device with one its terminals coupled to the bit-line.

In one embodiment, the bit-line is a continuous bit-line that couples to the first and second bit-cells. In one embodiment, the buffer comprises: a first inverter with an input coupled to the first select-line; and a second inverter with an input coupled to an output of the first inverter, the second inverter coupled to the second select-line. In one embodiment, the first and second select-lines and the bit-line extend in a direction which are parallel to one another.

In another example, a system is provided which comprises: a memory; a processor coupled to the memory, the processor including another memory according to the apparatus discussed above; and a wireless interface for allowing the processor to communicate with another device.

In another example, a magnetic random access memory (MRAM) is provided which comprises: a plurality of rows, each row including: a plurality of bit-cells, each bit-cell having an MTJ device coupled to a transistor; and a plurality of buffers, each of which to buffer a select-line signal for a group of bit-cells among the plurality of bit-cells; and a plurality of bit-lines, each row sharing a single bit-line among the plurality of bit-cells in that row.

In one embodiment, the MRAM further comprises a plurality of columns, each column providing a word-line to a column of bit-cells from the plurality of bit-cells. In one embodiment, each row further comprises a plurality of select-lines some of which are coupled to an input of the buffer, and some of which are coupled to an output of the buffer. In one embodiment, the plurality of select-lines and the bit-line for each row extend in a direction which are parallel to each other.

In another example, a system is provided which comprises: a processor; and a memory coupled to the processor, the memory according to the MRAM discussed above; and a wireless interface for allowing the processor to communicate with another device.

In another example, a method is provided which comprises: forming rows of bit-lines; forming rows of a plurality of select-lines, each row having multiple select-lines from the plurality of select-lines; forming a plurality of resistive memory element based bit-cells, each of which in a row are coupled to one of the rows of bit-lines, and some of the resistive memory element based bit-cells in a row are coupled to multiple select-lines; and forming a plurality of buffers, each of which in a row are coupled to multiple select-lines of that row.

In one embodiment, each of the rows of bit-lines is a continuous bit-line extending in a first direction. In one embodiment, each of the plurality of select-lines extends in the first direction. In one embodiment, the plurality of buffers is placed in a diagonal position in an array of plurality of resistive memory element based bit-cells. In one embodiment, the plurality of resistive memory element based bit-cells is a plurality of MTJ based bit-cells.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a first select-line;
   a second select-line;
   a bit-line;
   a first bit-cell including a resistive memory element and a transistor, the first bit-cell coupled to the first select-line and the bit-line;
   a buffer with an input coupled to the first select-line and an output coupled to the second select-line, the buffer to regenerate a signal from the first select-line to the second select-line; and
   a second bit-cell including a resistive memory element and a transistor, the second bit-cell coupled to the second select-line and the bit-line.

2. The apparatus of claim 1, wherein the first bit-cell includes:
   a first terminal coupled to the bit-line;
   a second terminal coupled to the first select-line; and
   a third terminal coupled to a word-line.

3. The apparatus of claim 1, wherein the second bit-cell includes:
   a first terminal coupled to the bit-line;

a second terminal coupled to the second select-line; and
a third terminal coupled to a word-line.

4. The apparatus of claim 1, wherein each of the resistive memory elements of the first and second bit-cells includes an MTJ device with one its terminals coupled to the bit-line.

5. The apparatus of claim 1, wherein the bit-line is a continuous bit-line that couples to the first and second bit-cells.

6. The apparatus of claim 1, wherein the buffer comprises:
a first inverter with an input coupled to the first select-line; and
a second inverter with an input coupled to an output of the first inverter, the second inverter coupled to the second select-line.

7. The apparatus of claim 1, wherein the first and second select-lines and the bit-line extend in a direction which are parallel to one another.

8. A system comprising:
a memory;
a processor coupled to the memory, the processor including another memory which comprises:
a first select-line;
a second select-line;
a bit-line;
a first bit-cell including a resistive memory element and a transistor, the first bit-cell coupled to the first select-line and the bit-line;
a buffer with an input coupled to the first select-line and an output coupled to the second select-line, the buffer to regenerate a signal from the first select-line to the second select-line; and
a second bit-cell including a resistive memory element and a transistor, the second bit-cell coupled to the second select-line and the bit-line; and a wireless interface for allowing the processor to communicate with another device.

9. The system of claim 8, wherein the first bit-cell includes:
a first terminal coupled to the bit-line;
a second terminal coupled to the first select-line; and
a third terminal coupled to a word-line.

10. A method comprising:
forming rows of bit-lines;
forming rows of a plurality of select-lines, each row having multiple select-lines from the plurality of select-lines;
forming a plurality of resistive memory element based bit-cells, respective ones of the respective memory element based bit-cells in a same row being coupled to one of the rows of bit-lines and one of the multiple select-lines of the same row; and
forming a plurality of buffers, each buffer coupled to respective multiple select-lines of a same row, the buffers comprising respective circuits to regenerate respective signals from a respective first of the multiple select-lines of a same row to a respective second of the multiple select lines of a same row.

11. The method of claim 10, wherein each of the rows of bit-lines is a continuous bit-line extending in a first direction.

12. The method of claim 11, wherein each of the plurality of select-lines extends in the first direction.

13. The method of claim 10, wherein contacts to the plurality of buffers are placed in a diagonal position in an array of plurality of resistive memory element based bit-cells.

14. The method of claim 10, wherein the plurality of resistive memory element based bit-cells is a plurality of MTJ based bit-cells.

* * * * *